United States Patent [19]

Endo et al.

[11] Patent Number: 4,840,872
[45] Date of Patent: Jun. 20, 1989

[54] PATTERN FORMING METHOD BY USE OF X-RAY EXPOSURE

[75] Inventors: Masayuki Endo, Izumi; Masaru Sasago; Kazufumi Ogawa, both of Hirakata, all of Japan

[73] Assignee: Matsushita Electric Industrial Co., Ltd., Osaka, Japan

[21] Appl. No.: 108,698

[22] Filed: Oct. 15, 1987

[30] Foreign Application Priority Data

Oct. 16, 1986 [JP] Japan .................................. 61-245705

[51] Int. Cl.$^4$ ........................ G03C 1/495; G03C 5/00
[52] U.S. Cl. .................................... 430/273; 430/271;
430/296; 430/311; 430/325; 430/326; 430/966;
430/967; 430/924
[58] Field of Search ............... 430/311, 325, 326, 966,
430/967, 296, 273, 281, 924, 327

[56] References Cited

U.S. PATENT DOCUMENTS

| | | | |
|---|---|---|---|
| 4,061,829 | 12/1977 | Taylor | 430/966 |
| 4,201,580 | 5/1980 | Feit | 430/966 |
| 4,262,073 | 4/1981 | Pampalone et al. | 430/967 |
| 4,287,277 | 9/1981 | Matsumoto et al. | 430/296 |
| 4,461,825 | 7/1984 | Kato et al. | 430/273 |
| 4,746,596 | 5/1988 | Yoshioka et al. | 430/967 |

Primary Examiner—Paul R. Michl
Assistant Examiner—C. D. RoDee
Attorney, Agent, or Firm—Wenderoth, Lind & Ponack

[57] ABSTRACT

A pattern forming method in which a water-soluble organic film absorbing secondary electrons or soft X-rays is formed on a resist layer and thereafter, pattern exposure, development are carried out. The water-soluble organic film containing halogen, sulfur, metal atom, etc. absorbs secondary electrons or soft X-rays which are generated from a mask in X-rays exposure so that only X-rays passed through openings of the mask are applied to a resist layer and a super fine pattern of high aspect ratio can be obtained.

9 Claims, 2 Drawing Sheets

PATTERN FORMING METHOD BY USE OF X-RAY EXPOSURE

BACKGROUND OF THE INVENTION

This invention relates to a pattern forming method by use of X-ray exposure, and more particularly to a pattern forming method which is capable of suppressing unnecessary exposure caused by secondary electrons or soft X-rays which are generated from a mask so that pattern contrast is improved.

As the integration level of semiconductor integrated circuits is increased, researchers have been paying attention to X-ray source as an exposure apparatus by which semiconductor integrated circuits are manufactured.

In X-ray lithography, development of resist materials which are used therefor have proceeded poorly since current resist materials are of low sensitivity. On the other hand, X-ray lithography has a problem in that pattern dimension is aggravated by dispersion of secondary electrons of X-ray.

FIG. 1 shows a conventional pattern forming method which uses conventional resist material. In FIG. 1A, substrate 1 is coated with resist 2 (e.g., CMS manufactured by Toyo Soda) by use of spin coating method. Then, in FIG. 1B, resist 2 is exposed to X-rays 4 selectively through mask 5. Thereafter, in FIG. 1C, development is carried out by use of a 1:1 mixture solution of isopropyl-alcohol and methyl-isobutyl-ketone to remove the unnecessary portion of resist 2 so that resist pattern 6 is formed.

In the FIG. 1B step, when X-rays 4 are applied to mask 5 which is made of, for example, Au, secondary electrons 7 are generated from mask 5. The secondary electrons 7 are, then, applied to resist 2 so that a part of resist to which secondary electrons 7 are exposed is sensitized. Therefore, resist pattern 6 which is obtained at the FIG. 1C step is different from pattern of mask 5. The secondary electrons 7 may be soft X-rays. Soft X-rays are generated when X-rays 4 are applied to mask 5.

SUMMARY OF THE INVENTION

The present invention, therefore, has as its principal object the provision of an improvement pattern forming method which is capable of solving the above-stated problem.

Another object of the invention is to provide an improved pattern forming method which is capable of suppressing unnecessary exposure caused by secondary electrons or soft X-rays which are generated from a mask so that pattern contrast is improved.

These and other objects are accomplished according to the present invention, by a pattern forming method in which a water-soluble organic film is formed on a resist for absorbing the secondary electrons on soft X-ray therein and for preventing the occurrence of unnecessary exposure of the resist, thereby the desired resist pattern being formed with high precision.

While the novel features of the invention are set forth with particularity in the appended claims, the invention, both as to organization and content, will be better understood and appreciated, along with other objects and features thereof, from the following detailed description taken in conjunction with the drawings.

DETAILED DESCRIPTION OF THE INVENTION

Firstly, a water-soluble organic film which is used in a pattern forming method of the invention is explained.

The water-soluble organic film contains atoms of large absorbing level to X-ray, electrons such as heavy metal, halogen, sulfur. Therefore, the water-soluble organic film absorbs low-energy X-rays or secondary electrons which are generated from a mask, specifically speaking, the shield portion of the mask by the operation of the above-stated atoms of high absorbing ability, and the low-energy X-rays, i.e., soft X-rays or secondary electrons do not reach the resist layer.

It is of course the case that X-ray which is passed through openings of a mask is absorbed a little by the water-soluble organic film. However, the energy of the X-rays passed through the openings of the mask is much larger than that of X-rays passed through the shield portion of the mask (approximately 1000–10000 times) and therefore, it is possible to carry out the exposure of the resist layer with a sensitivity reduction of approximately 0.1–1%, which means that throughput is not decreased in the actual processes.

The water-soluble organic film can be formed without being mixed with a resist layer which is made of organic solvent. When the film is removed, its removal is accompanied by the use of water or alkaline solution so that a surface of the resist layer is not injured at all.

The water-soluble organic film is represented by the following compounds.

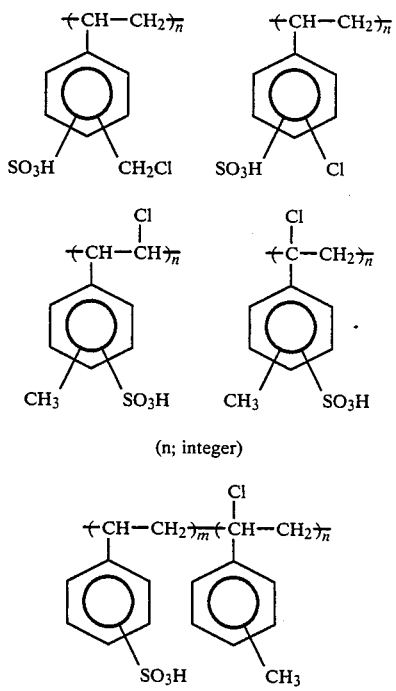

(n; integer)

-continued

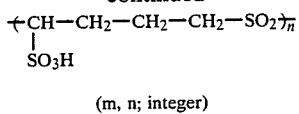

(m, n; integer)

The water-soluble organic film may be of water-soluble organic material which contains these compounds and metal atoms such as Pb $(CO_3)_2$, Cr, W, Mo.

Incidentally, in case that the film contains the above-stated metal atoms, halogen atom or sulfur atom can be removed from the film.

A pattern forming method as one of embodiments according to the invention is now explained with reference to FIGS. 2A through 2E.

Figure 1A:
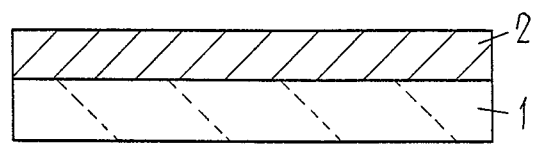
FIGS. 1A through 1C are sectional views showing a conventional pattern forming method.
Figure 1B:
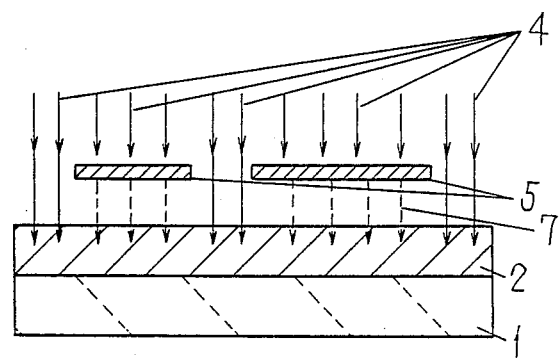
Figure 1C:
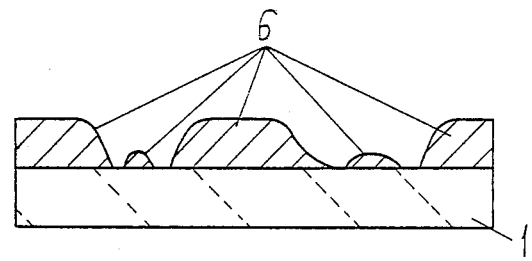
Figure 2A:
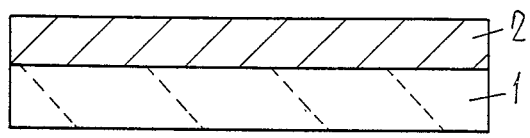
FIGS. 2A through 2E are sectional views showing a pattern forming method by use of X-ray exposure as one embodiment of the invention.
Figure 2B:
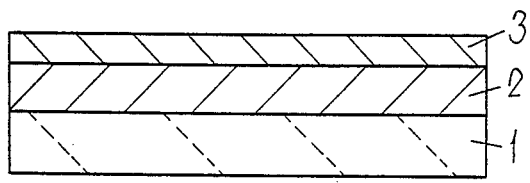

Semiconductor substrate 1 is coated with X-ray resist layer 2 (e.g., CMS manufactured by Toyo Soda) with 0.5 μm thickness in FIG. 2A. Then, the above-stated water-soluble organic film 3 is formed on said resist layer 2 with 0.15 μm thickness by use of spinning coating method in FIG. 2B. In this embodiment, the water-soluble organic film is represented by the following formula.

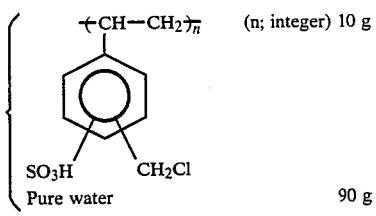

Figure 2C:
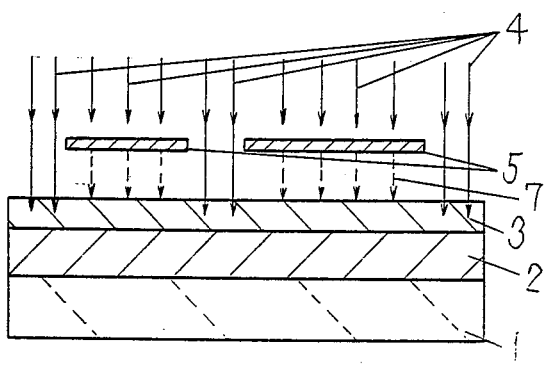
Figure 2D:
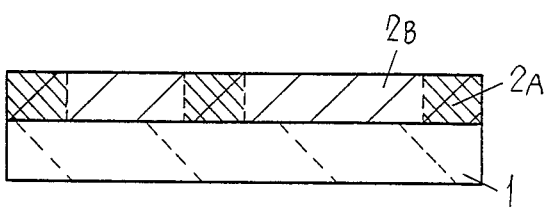
Figure 2E:
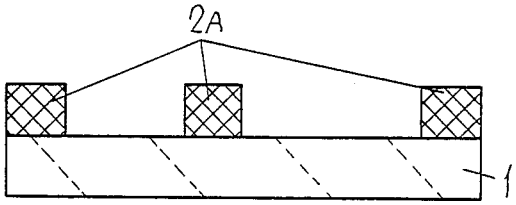

Then, in FIG. 2C, selective X-ray 4 (wavelength: 20 Å) exposure is carried out through mask 5. Then, in FIG. 2D, water-soluble organic film 3 is removed by pure water, and in FIG. 2E, development is carried out by use of 1:1 mixture solution (alkaline solution) of isopropyl-alcohol and methyl-isobutyl-ketone, so that unexposed resist layer 2B is removed and exposed resist pattern 2A is formed. Pattern 2A coincides with pattern of mask 5 with super fine pattern dimension of 0.2 μm and high precision. Incidentally, organic film 3 can be removed by alkaline solution for developing resist layer 2, etc., at the same time of removal of resist layer 2B. The wavelength of X-ray is not limited to 20 Å by may be of 5–500 Å where the same advantages can be obtained.

A second embodiment is now described. This embodiment is almost the same as the above-described first embodiment. The difference is that the second embodiment uses a water-soluble organic material which is represented by the following formula.

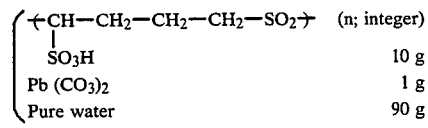

Incidentally, X-rays which are used in ths invention may be from electron-beam-energization-type X-ray sources, plasma X-ray sources, or SOR (synchrotron radiation) light, etc.

This invention is a pattern forming method in which a water-soluble organic film absorbing secondary electrons or soft X-rays is formed on a resist layer and thereafter, pattern exposure, development are carried out to form a pattern. The water-soluble organic film containing halogen, sulfur, metal atom, etc. absorbs secondary electrons, soft X-ray which are generated from a mask in X-ray exposure. Therefore, only X-rays which passes through openings of the mask are applied to a resist layer so that pattern configuration is improved, i.e., a super fine pattern of high aspect ratio is obtained.

Incidentally, the X-ray resist layer which is used in this invention is not limited to the above-stated one. That is, both positive and negative type resists can be used. As an example of a negative type X-ray resist, there are chlorinated polymethyl-styrene, brominated polymethyl-styrene and iodonatated polymethyl-styrene. As examples of a positive type X-ray resist, there are PBS (polybutene-sulfate) and FBM (manufactured by Daikin;

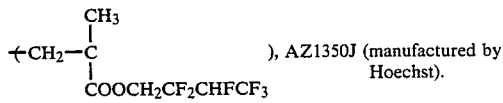

), AZ1350J (manufactured by Hoechst).

While specific embodiments of the invention have been illustrated and described herein, it is realized that modifications and changes will occur to those skilled in the art. It is therefore to be understood that the appended claims are intended to cover all modifications and changes as fall within the true spirit and scope of the invention.

We claim:

1. A pattern forming method comprising the steps of:
   forming a resist layer on a semiconductor substrate;
   forming a water-soluble organic film on said resist layer, said water-soluble organic film containing materials of high absorbing efficiency to soft X-rays or electrons,
   selectively exposing said water-soluble organic film on said resist layer to X-rays,
   removing said water-soluble organic film and
   selectively developing said resist layer to form a resist pattern.

2. The method of claim 1, wherein said X-rays are generated from an electron-beam-energization type X-ray source, plasma X-ray source or synchrotron radiation light.

3. The method of claim 1, wherein said water-soluble organic film comprises at least one of the following compounds:

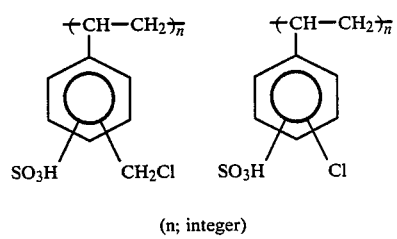

(n; integer)

-continued

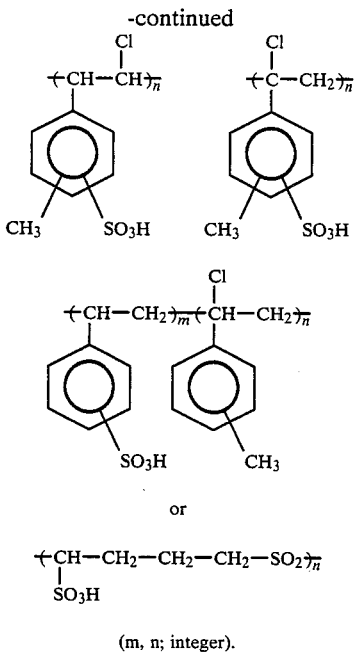

or

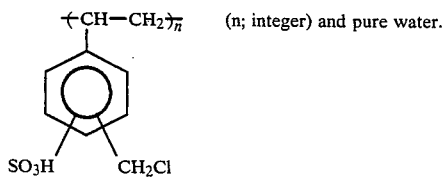

(m, n; integer).

4. The method of claim 1, wherein said water-soluble organic film contains at least one of the following metals: Pb, Cr, W or Mo.

5. The method of claim 1, wherein said water-soluble organic film contains

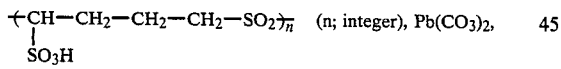

(n; integer) and pure water.

6. The method of claim 1, wherein said water-soluble organic film contains

+CH—CH₂—CH₂—CH₂—SO₂)ₙ  (n; integer), Pb(CO₃)₂,
|
SO₃H and pure water.

7. A pattern forming method comprising the steps of:
forming a resist layer on a semiconductor substrate;
forming an organic film on said resist layer, said organic film containing a water-soluble organic material which contains halogen or sulfur atoms and has a high absorbing efficiency to soft X-rays or electrons; and
selectively exposing said water-soluble organic film on said resist layer to X-rays,
removing said water-soluble organic film, and
selectively developing said resist layer to form a resist pattern.

8. The method of claim 3, wherein said X-rays are generated from an electron-beam-energization type X-ray source, plasma X-ray source or synchrotron radiation light.

9. A pattern forming method comprising the steps of:
forming a resist layer on a semiconductor substrate;
forming a water-soluble organic film on said resist layer, said water-soluble organic being represented by:

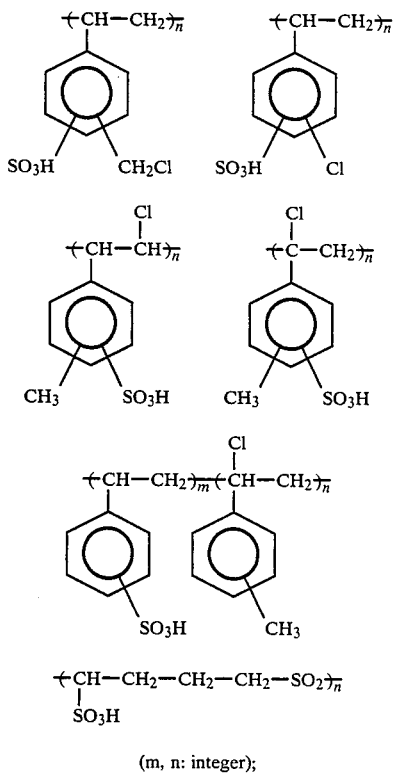

(m, n: integer);

selectively exposing said water-soluble film on said resist layer to X-rays,
removing said water-soluble film and
selectively developing said resist layer to form a resist pattern.

* * * * *